United States Patent [19]

Demmer et al.

[11] Patent Number: 4,618,564
[45] Date of Patent: Oct. 21, 1986

[54] PROCESS FOR PRODUCTION OF POSITIVE IMAGES USING SULFONIC ACID PRECURSORS

[75] Inventors: Christopher G. Demmer, Cherry Hinton; Edward Irving, Burwell, both of England

[73] Assignee: Ciba-Geigy Corporation, Ardsley, N.Y.

[21] Appl. No.: 738,197

[22] Filed: May 24, 1985

[30] Foreign Application Priority Data

May 25, 1984 [GB] United Kingdom ................. 8413395

[51] Int. Cl.[4] ........................ G03C 1/495; G03C 5/16
[52] U.S. Cl. .................................... 430/270; 430/326; 430/914; 430/919; 430/920; 430/921; 430/922; 430/923; 430/924; 430/311
[58] Field of Search ............... 430/326, 270, 914, 919, 430/920, 921, 922, 923, 924, 311

[56] References Cited

U.S. PATENT DOCUMENTS

| 4,098,744 | 7/1978 | Allen et al. ........................ 260/29.3 |
| 4,153,586 | 5/1979 | Hockswender et al. ............ 528/101 |
| 4,247,611 | 1/1981 | Sander et al. .................... 430/326 X |
| 4,258,121 | 3/1981 | Kojima ................................ 430/281 |
| 4,317,757 | 3/1982 | Kooijmans et al. ............. 525/510 X |
| 4,332,709 | 6/1982 | Kooijmans et al. ............. 525/533 X |
| 4,371,605 | 2/1983 | Renner ................................ 430/280 |
| 4,411,823 | 10/1983 | Hageman et al. .................. 430/284 |

FOREIGN PATENT DOCUMENTS 2120263 11/1983 United Kingdom .

OTHER PUBLICATIONS

Derwent Abstract 72755 E/35 (European Patent Application 58638, Aug. 25, 1982).
Derwent Abstract 83-724636/31 (European Patent Application No. 84515-A, Jul. 27, 1983).

Primary Examiner—John E. Kittle
Assistant Examiner—Cynthia Hamilton
Attorney, Agent, or Firm—Luther A. R. Hall

[57] ABSTRACT

Positive images are produced by (i) exposing to actinic radiation in a predetermined pattern a composition supported on a substrate, which composition comprises a film-forming organic material and a substance which releases a sulphonic acid on exposure to actinic radiation, thereby rendering the composition more soluble in the developer in the exposed areas than the unexposed areas, and (ii) treating the composition with the aqueous base developer to remove the unexposed areas. The image-forming process may be used in the production of printing plates and electrical circuits.

20 Claims, No Drawings

PROCESS FOR PRODUCTION OF POSITIVE IMAGES USING SULFONIC ACID PRECURSORS

This invention relates to a process for the production of an image using a positive photoresist, tc photosensitive compositions useful in such a process, and to supports bearing such a composition or an image produced by the aforesaid process.

In the production of an image using a positive photoresist, portions of the resist which are exposed to actinic radiation are rendered more soluble in, or at least more easily removable by, a developer than the unexposed portions. Removal when required of the exposed portions by means of the developer, leaving the unexposed portions intact, results in formation of a positive image.

Commercially available positive photoresist compositions generally contain, in addition to a film-forming organic material, an o-naphthoquinone diazide which decomposes on exposure to actinic radiation, evolving nitrogen and forming an indenecarboxylic acid. The film-forming organic material is usually an alkali-soluble phenol-formaldehyde novolak resin. Its dissolution into aqueous alkaline solution is inhibited by the naphthoquinone diazide; when, however, this diazide is decomposed in the actinically-irradiated areas, its efficacy as dissolution rate inhibitor decreases and the exposed areas of the coating become more soluble in a basic developer than are the unexposed areas. However, the quinonediazides are not entirely satisfactory, due to their thermal instability; even protected from actinic radiation they decompose at moderately elevated temperatures, and the quality of the image produced is then inferior. Further, relatively large proportions of these diazides are required for them to be useful as solubility inhibitors. As they absorb strongly in the preferred deep ultraviolet range, compositions containing them are relatively opaque to radiation in that range and cannot be developed in depth, e.g., to the interface of the substrate, because the radiation cannot penetrate deeply into the coating.

We have now found that by exposing to actinic radiation a composition comprising a film-forming organic material and a substance which releases a sulphonic acid on exposure to the radiation, the solubility of the composition in an aqueous base developer is increased in the exposed areas.

Although substances which release a sulphonic acid on exposure to actinic radiation are known, they have hitherto been utilised to cure acid-curable substances such as aminoplasts and phenol-aldehyde resols or to act as a source of free radicals in the photopolymerisation of substances having ethylenically unsaturated groups. It had not previously been known that compounds acting as a latent source of a sulphonic acid could depress the dissolution rate of certain film-forming materials in aqueous basic media, and that this effect could be nullified by bringing about the liberation of a sulphonic acid.

Accordingly one aspect of this invention provides a process for the production of an image comprising (i) exposing to actinic radiation in a predetermined pattern a composition supported on a substrate, which composition comprises (A) a film-forming organic material and (B) a substance which releases a sulphonic acid on exposure to actinic radiation, thereby rendering the composition more soluble in an aqueous base developer in exposed areas than in unexposed areas, and (ii) removing the composition in the exposed areas by treatment with the aqueous base developer.

A further aspect of this invention provides a photosensitive composition suitable for carrying out the process of the invention which comprises (A) a film-forming organic material and (B) a substance which releases a sulphonic acid on exposure to actinic radiation, the composition being substantially free from ethylenically unsaturated material which is polymerised by means of free radicals and from material which is polymerised by sulphonic acids.

The substance liberating a sulphonic acid on exposure to actinic radiation is preferably either a sulphonate ester of an aromatic alcohol containing a carbonyl group in a position alpha or beta to the sulphonate ester group, or else an N-sulphonyloxy derivative of an amide or imide, the derivative containing an aromatic group, that is a ring system containing 4p+2 pi-electrons, where p is the number of rings in the system, encompassing heterocyclic aromatic groups such as pyridyl, furyl, and thienyl groups as well as benzenoid groups such as phenyl, naphthyl, and phenanthryl.

Typical such sulphonate esters are those of formula

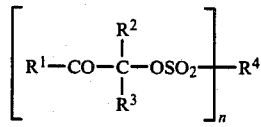

I or

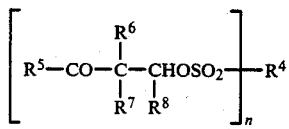

II where n is 1 or 2, $R^1$ is phenyl or naphthyl which is unsubstituted, or substituted by 1,2 or 3 of —Cl, —Br, —CN, —NO$_2$, $C_1$-$C_{12}$ alkyl, $C_1$-$C_4$—alkoxy phenyloxy, tolyloxy, phenylthio, tolylthio, $C_1$-$C_8$—alkylthio, —SCH$_2$CH$_2$OH, $C_1$-$C_4$—alkylsulphonyl, phenylsulphonyl, $C_2$-$C_4$—alkoxycarbonyl, $C_1$-$C_4$—alkylamino, $C_2$-$C_4$—dialkylamino, phenyl—COHN— or $C_1$-$C_4$—alkyl—CONH—, or by benzoyl, or $R^1$ is anthryl, phenanthryl, thienyl, pyridyl, furyl, indolyl or tetrahydronaphthyl, and $R^2$ and $R^3$ independently of one another are each hydrogen, or $C_1$-$C_8$ alkyl which is unsubstituted or substituted by —OH, —Cl, $C_1$-$C_4$—alkoxy, —CN, $C_2$-$C_5$—alkoxycarbonyl, phenyl, chlorophenyl, $C_7$-$C_{10}$ alkylphenyl or $C_7$-$C_{10}$—alkoxyphenyl, or they are benzoyl, in addition $R^3$ is phenyl which is unsubstituted or substituted by —Cl, $C_1$-$C_4$ alkyl, $C_1$-$C_4$—alkoxy or $C_1$-$C_4$—alkylthio, or it is $C_2$-$C_8$—alkoxycarbonyl, —CN, $C_1$-$C_4$—alkyl—NH—CO—, phenyl—NH—CO— or —CONH$_2$, or $R^2$ and $R^3$ together with the carbon atom to which they are bound form a $C_4$-$C_6$—cycloalkyl ring.

$R^4$ is, when n=1, $C_1$-$C_{18}$—alkyl, phenyl which is unsubstituted or substituted by halogen, $C_1$-$C_{12}$—alkyl, $C_1$-$C_4$ alkoxy, $C_1$-$C_4$—alkyl—CONH—, phenyl—

CONH—, —NO$_2$ or benzoyl, or it is naphthyl which is unsubstituted or substituted by halogen, C$_1$-C$_{12}$—alkyl or C$_1$-C$_4$—alkoxy, or it is C$_5$-C$_6$—cycloalkyl, C$_7$-C$_9$—aralkyl, campheryl, —CF$_3$, —CCl$_3$, —F, or —NH$_2$, and R$^4$ is, when n=2, a —(CH$_2$)$_m$ group, wherein m is 2 to 8, or phenylene or naphthylene each unsubstituted or substituted by C$_1$-C$_{15}$—alkyl, R$^5$ is phenyl or naphthyl which are each unsubstituted or substituted by 1, 2 or 3 of —Cl, —Br, C$_1$-C$_{12}$—alkyl, phenyl, C$_1$-C$_8$—alkoxy, phenyloxy, benzyloxy, C$_1$-C$_8$—alkylthio, phenylthio, —SCH$_2$CH$_2$OH, C$_1$-C$_4$—alkyl—CONH—, benzoylamino or dimethylamino, or by benzoyl, or R$^5$ is anthryl or phenanthryl, R$^6$ is hydrogen, —OH, C$_1$-C$_4$—alkoxy, —OSi(CH$_3$)$_3$, —OCOCH$_3$, or C$_1$-C$_8$—alkyl which is unsubstituted or substituted by phenyl, R$^7$ is hydrogen, or C$_1$-C$_8$—alkyl which is unsubstituted or substituted by phenyl, or R$^7$ is —CN, benzoyl, C$_1$-C$_4$—alkylcarbonyl, C$_2$-C$_5$—alkoxycarbonyl or phenyl, R$^8$ is hydrogen, C$_1$-C$_8$—alkyl which is unsubstituted or substituted by —OH, —Cl or phenyl, or it is phenyl which is unsubstituted or substituted by —OH, —Cl, C$_1$-C$_4$—alkyl or C$_1$-C$_4$—alkoxy, or R$^8$ is C$_2$-C$_6$—alkenyl, C$_8$-C$_9$—phenylalkenyl, furyl, thienyl or —CCl$_3$, C$_5$-C$_6$—cycloalkyl or C$_5$-C$_6$—cycloalkenyl and moreover R$^5$ with R$^7$ or R$^6$ with R$^7$, together with the carbon structure to which they are bound, form a 5- or 6-membered ring which contains 1 to 5 —CH$_2$—, —CH(CH$_3$)—, —C(CH$_3$)$_2$—, —O—, —S—, —SO—, —SO$_2$—, —CO—, —N(CO—C$_1$-C$_4$—alkyl)— or N(COC$_6$H$_5$)— groups.

Particularly preferred sulphonates of formula I or II are those where n is 1, R$^1$ is phenyl which is unsubstituted or substituted by chlorine, methyl, methoxy, methylthio, phenylthio, —SCH$_2$CH$_2$OH or benzoyl, R$^2$ is hydrogen or C$_1$-C$_4$—alkyl, R$^3$ is hydrogen, C$_1$-C$_4$—alkyl or phenyl, or R$^2$ and R$^3$ together with the carbon atom to which they are bound form a cyclohexane ring, R$^4$ is C$_1$-C$_{18}$—alkyl, phenyl or naphthyl each unsubstituted or substituted by C$_1$-C$_{12}$—alkyl, or it is campheryl, R$^5$ is phenyl which is unsubstituted or substituted by —Cl, C$_1$-C$_4$—alkoxy, —SCH$_3$ or phenyl, R$^6$ is —OH or C$_1$-C$_4$—alkyl, R$^7$ is C$_1$-C$_4$—alkyl or phenyl, and R$^8$ is —H, C$_1$-C$_4$—alkyl, furyl or —CCl$_3$, or R$^7$ with R$^8$ together with the carbon atom to which they are bound form a cyclohexane ring.

More especially preferred are sulphonates of the formulae I and II wherein n=1, R$^1$ and R$^5$ are each phenyl, p-tolyl or p-methylthiophenyl, R$^2$ is hydrogen, R$^3$ is methyl, isopropyl, phenyl, n-decyl or benzyl, R$^4$ is phenyl, p-tolyl or p-n-dodecylphenyl, R$^6$ is —OH, R$^7$ is —CH$_3$ or phenyl, and R$^8$ is —H.

These sulphonates of hydroxyl-containing alpha- or beta-ketones and their preparation are described in British patent specification No. 2120263A. In that specification, there is described also their use as latent sources of sulphonic acids, these acids being liberated on exposure to actinic radiation to cure aminoplasts or phenoplasts.

Other suitable sulphonates are of formula

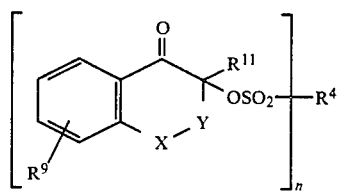

where n and R$^4$ have the meanings assigned above,

R$^9$ represents a hydrogen atom or one, two or three —Cl, —Br, —NO$_2$, C$_1$-C$_{12}$ alkyl, C$_1$-C$_4$ alkoxy, phenoxy, phenylthio, C$_1$-C$_8$ alkylthio, or —SCH$_2$CH$_2$OH substituents, X represents —O—, —S—, —SO$_2$—, —CH$_2$—, —C(CH$_3$)$_2$— or >NCOR$^{10}$, where R$^{10}$ is C$_1$-C$_4$ alkyl or phenyl, Y represents a direct bond or —CH$_2$—, and R$^{11}$ represents a hydrogen atom; C$_1$-C$_8$ alkyl, optionally substituted by —OH, —Cl, C$_1$-C$_4$ alkoxy, CN, C$_2$-C$_5$ alkoxycarbonyl, phenyl, chlorophenyl, C$_7$-C$_{10}$ alkylphenyl, or C$_7$-C$_{10}$ alkoxyphenyl; phenyl, optionally substituted by —Cl, C$_1$-C$_4$ alkyl, C$_1$-C$_4$ alkoxy or C$_1$-C$_4$ alkylthio; C$_2$-C$_8$ alkoxycarbonyl; or CN.

Particularly preferred sulphonates of formula III are those where n is 1, R$^9$ and R$^{11}$ represent H, X and Y each represent —CH$_2$—, and R$^4$ denotes a C$_1$-C$_{18}$ alkyl group optionally substituted by phenyl or naphthyl, or a campheryl group.

These sulphonates are described in European Patent Specification No. EP-A-0 084 515 as radiation-activated latent sources of sulphonic acids for the hardening of phenoplasts, aminoplasts, and mixtures of aminoplasts with hydroxyl-containing polyacrylates, polyesters, and alkyds.

Further suitable sulphonate esters are those of alphamethylolbenzoins, or their ethers, having the formula

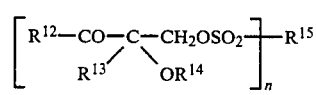

where n has the meaning assigned above,

R$^{12}$ and R$^{13}$ are the same or different phenyl radicals, optionally substituted by C$_1$-C$_4$ alkyl, C$_1$-C$_4$ alkoxy, halogen, phenyl, or dialkylamino in which the alkyl groups have 1-4 carbon atoms and may be substituted by a hydroxyl group, R$^{14}$ represents optionally substituted C$_5$-C$_{18}$—alkyl, C$_2$-C$_{18}$ alkenyl, C$_5$-C$_8$ cycloalkyl or cycloalkenyl, optionally substituted C$_6$-C$_{20}$ aryl, furfuryl, or a group —(E)CH—OZ where E represents CH$_3$ and Z represents C$_2$-C$_4$ alkyl or E and Z together represent a 1,3- or 1,4-alkylene group of 3 to 4 carbon atoms, optionally substituted by a C$_1$-C$_4$ alkoxy group, R$^{15}$ represents optionally substituted C$_1$-C$_{20}$ alkyl, C$_4$-C$_{20}$ alkenyl, C$_5$-C$_8$ cycloalkyl, C$_5$-C$_8$ cycloalkenyl, phenyl, tolyl, naphthyl, alkaryl having 4-16 carbon atoms in the alkyl group, furfuryl, C$_6$-C$_{10}$ arylene, or C$_1$-C$_6$ alkylene.

These sulphonates are described in European Patent Specification No. EP-A-0037512 as photoinitiators for photopolymerisation of compounds containing activated ethylenic double bonds, and as a source of sulphonic acid in curing acid-curable resins or resin compositions, such as phenolic resins and aminoplasts.

Aromatic N-sulphonyloxyimides which may be employed have the formula

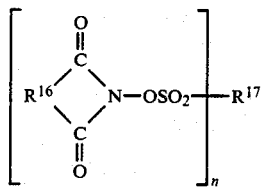

where n has the meaning assigned above, $R^{16}$ represents arylene, substituted arylene, alkylene, substituted alkylene, alkenylene, or substituted alkenylene, $C_2-C_6$ straight, branched, or cyclic alkylene, optionally substituted by phenyl, naphthyl, or $C_1-C_4$ alkyl; or $C_2-C_4$ alkenylene, optionally substituted by phenyl or $C_1-C_2$ alkyl; and $R^{17}$ represents, where n=1, $C_1-C_{18}$ straight or branched alkyl, optionally substituted by halogen or $C_1-C_4$ alkoxy; $C_6-C_{12}$ aryl, optionally substituted by $C_1-C_{15}$ alkyl, $C_1-C_4$ alkylCONH, phenylCONH, or $NO_2$; $C_5-C_6$ cycloalkyl, campheryl; $CF_3$; $CCl_3$; $CH_2Cl$; F; or $NH_2$, or $R^{17}$ represents, where n=2, $C_2-C_6$ alkylene, phenylene, or naphthylene, with the proviso that at least one of $R_{16}$ and $R^{17}$ is, or contains, an aromatic group.

In formula V, $R^{16}$ preferably represents an o-phenylene, or 1,2-, 2,3-, or 1,8-naphthylene group, optionally substituted by a chlorine or bromine atom or a nitro, $C_1-C_8$ alkyl, $C_1-C_4$ alkoxy, $C_1-C_{12}$ alkylthio, or phenylthio group, or an ethylene, propylene, cyclobutylene, cyclohexylene, phenylethylene, or vinylidene group; n=1; and $R^{17}$ represents a $C_6$ to $C_{10}$ aryl group, optionally substituted by a $C_1-C_{12}$ alkyl group or a chlorine atom.

Compounds of formula V are described in U.S. Pat. Nos. 4,258,121 and 4,371,605, and in European Patent Specification No. EP-A-0058638. In the first of these they are employed in the photopolymerisation of monomers having at least two ethylenically unsaturated groups. In the second reference they are disclosed as agents for photopolymerisation of compounds having one or two ethylenically unsaturated groups, of compositions which polymerise by ring-opening of cyclic groups such as lactones and epoxides, and of melamine resins. In the third of these Specifications they are employed as latent hardening catalysts for acid-hardenable stoving lacquers, particularly those based on aminoplasts and hydroxy-functional acrylates, and on phenoplasts.

Aromatic N-sulphonyloxy amides which may be used have the formula

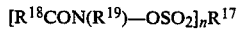     VI where $R^{17}$ and n have the meanings assigned above.

$R^{18}$ is an aliphatic, cycloaliphatic, or aromatic group, particularly phenyl, naphthyl, anthryl, or $C_6-C_{14}$ substituted aryl, wherein the substituents are $C_1-C_4$ alkyl, Cl, Br, F, $C_1-C_2$ alkoxy, CN, $NO_2$, dimethylamino, benzoyl, $OCH_2C_6H_5$, $OCF_3$, or phenyl, and $R^{19}$ is H, $C_1-C_4$ alkyl, or $R^{18}CO-$, at least one of $R^{18}$ and $R^{19}$ being, or containing, an aromatic group.

Compounds of formula VI are described in U.S. Pat. No. 4,371,605, as is their use in the photopolymerisation of ethylenically unsaturated compounds, of compositions which polymerise by ring-opening of cyclic groups such as lactones and epoxides, and of melamine resins.

The most preferred sulphonic acid-releasing substances (B) are sulphonate esters of benzoin or alphamethylolbenzoin, prticularly benzoin-p-toluenesulphonate and 3-(p-toluenesulphonyloxy)-2-hydroxy-2-phenyl-1-phenyl-1-propanone, and N-sulphonyloxy derivatives of 1,8-naphthalimide, particularly N-benzenesulphonyloxy- and N-(p-dodecylbenzenesulphonyloxy)-1,8-naphthalimide.

Preferably from 0.05 to 0.8, particularly about 0.2 to 0.6, part by weight of the sulphonic acid-liberating substance is used per part by weight of the film-forming organic material.

The film-forming organic material, which is soluble in an aqueous base, is preferably one containing phosphonic acid groups and particularly phenolic hydroxyl or carboxylic, sulphonic, or phosphoric acid groups.

Such materials include novolak resins from an aldehyde such as acetaldehyde or furfuraldehyde, but preferably formaldehyde, with a phenol such as phenol itself, phenol substituted by 1 or 2 chlorine atoms, such as p-chlorophenol, or 1 or 2 alkyl groups of 1 to 9 carbon atoms each, e.g., o-, m-, and p-cresol, the xylenols, p-tert.butyl phenol, and p-nonylphenol, p-phenylphenol, resorcinol, bis(4-hydroxyphenyl)methane, and 2,2-bis(4-hydroxy Other suitable materials include homopolymers and copolymers of ethylenically unsaturated carboxylic acids and carboxylic acid anhydrides. Such materials include homopolymers of acrylic and methacrylic acids and copolymers of these acids, with, for example, aliphatic unsaturated compounds such as ethylene, propylene, esters of acrylic and methacrylic acids, vinyl esters such as vinyl acetate, and vinyl aromatic compounds such as styrene and substituted styrenes. Other suitable polymers are styrene-maleic anhydride copolymers.

Further suitable materials are carboxyl-terminated polyesters such as those obtainable by reaction of a dihydric alcohol with a dicarboxylic acid. Dihydric alcohols which may be employed include ethylene glycol, diethylene glycol, and higher polyoxyethylene glycols; propane-1,2-diol, dipropylene glycol, and higher polyoxypropylene glycols; propane-1,3-diol; butane-1,4-diol and polyoxytetramethylene glycols; pentane-1,5-diol, resorcitol, quinitol, bis(4-hydroxycyclohexyl)methane, and 2,2-bis(4-hydroxycyclohexyl)propane. Dicarboxylic acids which may be employed include aliphatic acids such as succinic, glutaric, adipic, pimelic, suberic, azelaic, or sebacic acids, dimerised linoleic acid, aromatic acids such as phthalic, isophthalic, and terephthalic acids, and cycloaliphatic acids such as hexahydrophthalic acid.

Also suitable are acid group-containing adducts of polyepoxides having on average, more than one 1,2-epoxide group per molecule, with polycarboxylic acids, especially dicarboxylic acids, or with substances which contain a carboxylic, sulphonic, phosphonic or phosphoric acid group and also a group which reacts preferentially, under the conditions used for adduct formation, with the epoxide groups of the polyepoxide. Such a group is conveniently a primary or secondary aliphatic or aromatic amino group, or a mercapto group. Individual classes of acids suitable for forming the adducts are aliphatic, cycloaliphatic and aromatic dicarboxylic acids such as adipic, hexahydrophthalic and phthalic acids; aminocarboxylic acids such as glycine, aspartic acid, sarcosine, and p-aminobenzoic acid; aminosulphonic acids such as sulphanilic and metanilic acid; aminophosphonic acids such as 2-amino-1-phenylethyl phosphonic acid and 1-aminoethylidenebis(phosphonic acid); and mercaptocarboxylic acids such as thioglycolic and mercaptopropionic acids. Suitable polyepoxides include polyglycidyl ethers, particularly diglycidyl ethers, of polyhydric, particularly dihydric, phenols, for example, mononuclear phenols such as resorcinol, but preferably bisphenols such as bis(4-hydroxyphenyl)methane and 2,2-bis(4-hydroxyphenyl)propane; polyglycidyl ethers, particularly diglycidyl ethers, of polyhydric, particularly dihydric, alcohols, for example, ethylene glycol, butane-1,4-diol and 2,2-bis(4-hydroxycyclohexyl)propane; and diglycidyl esters of aliphatic, cycloaliphatic and aromatic dicarboxylic acids such as succinic, hexahydrophthalic and phthalic acids.

The preparation of carboxyl group-containing adducts of polyepoxides and aminocarboxylic acids is described in U.S. Pat. Nos. 4,098,744 and 4,332,709, while the production of adducts of polyepoxides and neutralised aminosulphonic acids is described in U.S. Pat. Nos. 4,317,757 and 4,332,709. Reaction of a polyepoxide with a mercaptocarboxylic acid to give a carboxyl-containing adduct is described in U.S. Pat. No. 4,153,586.

Formation of an image can be accelerated by including in the composition a photosensitiser, that is, a compound which acquires an excited state on irradiation and conveys the energy exothermally to the non-excited latent source of a sulphonic acid. Such photosensitisers include condensed aromatic hydrocarbons and their substituted derivatives, aromatic carbonyl compounds, aromatic nitro compounds and cationic and basic dyes. Individual classes of suitable photosensitisers are anthracenes, fluoranthenes, pyrenes, anthrones, thioxanthones such as 2-methyl- or 2-chlorothioxanthone, and benzophenones, particularly bis(dialkylamino)benzophenones such as 4,4'-bis(dimethylamino)benzophenone (Michler's ketone). A dye such as Crystal Violet may be included in the composition to make the image more easily discernible.

In carrying out the process of this invention, a layer of the composition from which the image is to be formed may be applied to a support from a solvent, e.g., 2-ethoxyethanol, 2-ethoxyethyl acetate, ethyl methyl ketone, N-methylpyrrolidone, dimethylformamide, or mixtures thereof, in a conventional manner, such as by dipping, spinning, spraying, or by roller. The solvent is then allowed or caused to evaporate, e.g. by air drying or by heating to a temperature below that in which any heat-curable component is cured. The support is usually of copper, aluminium, or other metal, silicon, oxides or nitrides of silicon, synthetic resin or plastics, such as a film of a polyester, a polyamide, or polyolefin, paper, or glass, and is coated such that the layer, on drying, is about 1–250 micrometers thick.

Exposing the composition to actinic radiation in a predetermined pattern may be achieved by exposure through an image-bearing transparency consisting of substantially opaque and substantially transparent areas, or by means of a computer-controlled laser beam. Actinic radiation of 200–600 nm is generally used, and suitable sources include carbon arcs, mercury vapour arcs, fluorescent lamps with phosphors emitting ultra violet light, argon and xenon glow lamps, tungsten lamps, and photographic flood lamps; of these, mercury vapour arcs and metal halide lamps are the most suitable. The exposure time required depends on such factors as the nature of the composition employed, the thickness of the layer, the type of radiation source, and its distance from the layer; it is usually of the order of 30 seconds to 4 minutes, but a suitable duration can readily be found by routine experimentation.

After its imagewise exposure, the layer of the composition is washed with a developer to remove the exposed areas, that is, those struck by radiation, leaving the unexposed areas. The developer dissolves the exposed areas, or renders them much more readily removable by gentle brushing or agitation.

The aqueous base developer may be an aqueous solution of a strong base such as triethylamine but an aqueous alkaline solution, e.g., one containing sodium hydroxide, sodium carbonate, or disodium hydrogen phosphate, is preferred. A small proportion, typically 5–15% by volume, of a water-miscible lower aliphatic alcohol, e.g. methanol, may be added to speed development.

After exposure and development, the substrate may be etched, either to remove metal from exposed areas in the formation of a printed circuit, or to increase the depth of the image and hence increase its differentiation, the remaining coating in the unexposed areas protecting the underlying substrate from attack. Suitable etching procedures, e.g., using ferric chloride or ammonium persulphate solutions on copper substrates, are well known. The whole area of the substrate can then, if desired, be exposed to further radiation for a more prolonged period in a non-imagewise manner, the remaining coating becoming soluble in basic solutions to expose the substrate below.

The process of this invention is useful in the production of printing plates and of printed, integrated or hybrid circuits.

The following Examples illustrate the invention. Unless otherwise specified, parts are by weight.

EXAMPLE 1

A solution of a mixed cresol novolak with softening point 136° C. (4 parts) and benzoin-p-toluenesulphonate (2 parts) in dimethylformamide (DMF) 6 parts is prepared. To this solution is added a 2% solution of Crystal Violet in DMF so that the image is more readily discernible. The mixture is coated by spincoating onto a cleaned copper-clad laminate and dried at 90° C. for 2 minutes to produce a coating 8 micrometers thick. The coating is irradiated through a negative using a 5000 w metal halide lamp at a distance of 75 cm for 1 minute. Development with 2% aqueous sodium hydroxide gives a good image in 90 seconds.

EXAMPLE 2

A solution of a mixed cresol novolak with softening point 136° C. (4 parts) and 3-(p-toluenesulphonyloxy)-2-hydroxy-2-phenyl-1-phenyl-1-propanone, i.e. alpha-(p-toluenesulphonyloxy)methyl benzoin, (2 parts), in DMF (6 parts) is prepared. To this solution is added a 2% solution of Crystal Violet in DMF (2 parts). The mixture is coated onto a cleaned copper-clad laminate and dried at 90° C. for 2 minutes to produce a coating 15 micrometers thick. The coating is irradiated through a negative using a 5000 w metal halide lamp at a distance of 75 cm for 1 minute. Development with 2% aqueous sodium hydroxide gives a good image in 25 seconds.

EXAMPLE 3

A solution of a styrene-maleic anhydride copolymer (SCRIPSET 520, mol. wt. 1300, molar ratio 4:1, obtainable from Cairn Chemicals Ltd.,) (3 parts) and 3-(p-toluenesulphonyloxy)-2-hydroxy-2-phenyl-1-phenyl-1-propanone (1 part) in DMF (12 parts) is prepared. To this solution is added a 2% solution of Crystal Violet in DMF (3 parts). The mixture is coated onto a cleaned copper-clad laminate and dried at 90° C. for 2 minutes to produce a coating 7 micrometers thick. The coating is irradiated through a negative using a 5000 w metal halide lamp at a distance of 75 cm for 1 minute. Development with 1% aqueous sodium hydroxide gives a good image in 1 minute.

EXAMPLE 4

A solution of a mixed cresol novolak with softening point 136° C. (4 parts) and N-(p-dodecylbenzenesulphonyloxy)-1,8-naphthalimide (2 parts) in a solvent mixture (6 parts) comprising 2-ethoxyethanol, 2-ethoxyethylacetate and ethyl methyl ketone in the volume ratio 2:2:1. To this solution is added a 2% solution of Crystal Violet in the above solvent mixture. The mixture is coated onto a cleaned copper-clad laminate and dried at 90° C. for 5 minutes to produce a coating 14 micrometers thick. The coating is irradiated through a negative using a 5000 w metal halide lamp at a distance of 75 cm for 2 minutes. Development with a mixture of aqueous 2% sodium hydroxide and methanol in the ratio 90:10 by volume gives a good image in 3 minutes.

EXAMPLE 5

A solution of a tert.butylphenol-phenol novolak (ratio 30:70, softening point 127° C. (4 parts) and N-(p-dodecylbenzenesulphonyloxy)-1,8-naphthalimide (2 parts) in the solvent mixture (6 parts) used in Example 4 is prepared. To this solution is added a 2% solution of Crystal Violet in the mixed solvents. The mixture is coated onto a cleaned copper-clad laminate and dried at 90° C. for 5 minutes to produce a coating 14 micrometers thick. The coating is irradiated through a negative using a 5000 w metal halide lamp at a distance of 75 cm for 2 minutes. Development with a mixture of 2% aqueous sodium hydroxide and methanol (90:10 by volume) gives a good image in 40 seconds.

EXAMPLE 6

A solution of a mixed cresol novolak with a softening point of 119° C. (5 parts) and N-(benzenesulphonyloxy)-1,8-naphthalimide (1 part) in DMF (12 parts) is prepared. To this solution is added a 2% solution of Crystal Violet in DMF (1 part). The mixture is coated onto a cleaned copper-clad laminate and dried at 90° C. for 5 minutes to produce a coating 5 micrometers thick. The coating is irradiated through a negative using a 5000 w metal halide lamp at a distance of 75 cm for 2 minutes. Development with aqueous sodium hydroxide (2%) gives a good image in 2 minutes. The image can be etched using a solution of ferric chloride (40%) at 30° C. for 3 minutes, leaving the coated areas intact. Further irradiation for 2 minutes without a negative permits removal of the remaining coating with 2% aqueous sodium hydroxide to expose the copper pattern below.

EXAMPLE 7

A solution of an acrylic copolymer prepared from methyl methacrylate and methacrylic acid (mole ratio 75:25, acid value 2.18 eq/kg) (4 parts) and 3-(p-toluenesulphonyloxy)-2-hydroxy-2-phenyl-1-phenyl-1-propanone (2 parts) in DMF (6 parts) is prepared. To this solution is added a 2% solution of Crystal Violet in DMF (2 parts). The mixture is coated onto a cleaned copper-clad laminate and dried at 90° C. for 3 minutes to produce a coating 12 micrometers thick. The coating is irradiated through a negative using a 5000 w metal halide lamp for 2 minutes. Development with 1% aqueous sodium hydroxide gives a good image in 40 seconds. The image can be etched using a solution of ferric chloride (40%) at 30° C. for 3 minutes leaving the coated area intact. Further irradiation for 2 minutes without a negative permits removal of the remaining coating with 2% aqueous sodium hydroxide to reveal the copper pattern below.

EXAMPLE 8

The solution prepared in Example 7 is coated onto aluminium and dried at 90° C. for 3 minutes to produce a coating 10 micrometers thick. The coating is irradiated through a negative using a 5000 w metal halide lamp for 2 minutes. Development with 1% aqueous sodium hydroxide gives a good image in 50 seconds.

EXAMPLE 9

A solution is prepared of a mixed cresol novolak with softening point 136° C. (4 parts), N-(p-dodecylbenzenesulphonyloxy)1,8-naphthalimide (2 parts), and, as sensitiser, Michler's ketone (0.2 part) in the mixed solvents described in Example 4 (6 parts). To this solution is added a 2% solution of Crystal Violet in the mixed solvents. The mixture is coated on a cleaned copper-clad laminate and dried at 90° C. for 5 minutes to produce a coating 14 micrometers thick. The coating is irradiated through a negative using a 5000 w metal halide lamp at a distance of 75 cm for 2 minutes. Development with a 2% aqueous solution of sodium hydroxide gives a good image in 2 minutes.

What is claimed is:

1. A process for the production of an image comprising
   (i) forming a composition which comprises
   (A) a film-forming organic material consisting essentially of an aqueous base-soluble material having a phenolic hydroxyl group or a carboxylic, sulfonic, phosphonic or phosphoric acid group, and
   (B) a substance which releases a sulfonic acid on exposure to actinic radiation, thereby effecting a reduction of the dissolution rate of said film-forming material in aqueous base, and
   (ii) exposing said composition to actinic radiation in a predetermined pattern, thereby nullifying said dissolution rate reduction to render the composition more soluble in an aqueous base developer in exposed areas than in unexposed areas, and
   (iii) removing the composition in the exposed areas by treatment with the aqueous base developer.

2. A process according to claim 1, in which the substance (B) is a sulfonate ester of an aromatic alcohol containing a carbonyl group or an aromatic N-sulfonyloxyimide.

3. A process according to claim 2, in which the sulfonate is of formula

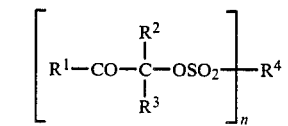 I or

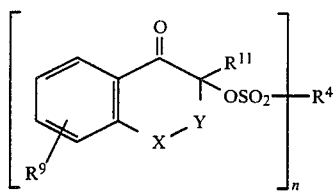 III where n is 1 or 2,

R$^1$ is phenyl or naphthyl which is unsubstituted, or substituted by 1,2 or 3 of —Cl, —Br, —CN, NO$_2$, C$_1$-C$_{12}$ alkyl, C$_1$-C$_4$—alkoxy phenyloxy, tolyloxy, phenylthio, tolylthio, C$_1$-C$_8$—alkylthio, —SCH$_2$CH$_2$OH, C$_1$-C$_4$—alkylsulfonyl, phenylsulfonyl, C$_2$-C$_4$—alkoxycarbonyl, C$_1$-C$_4$—alkylamino, C$_2$-C$_4$—dialkylamino, phenyl—CONH— or C$_1$-C$_4$—alkyl—CONH—, or by benzoyl, or R$^1$ is anthryl, phenanthryl, thienyl, pyridyl, furyl, indolyl or tetrahydronaphthyl, and R$^2$ and R$^3$ independently of one another are each hydrogen, or C$_1$-C$_8$ alkyl which is unsubstituted or substituted by —OH, —Cl, C$_1$-C$_4$—alkoxy, —CN, C$_2$-C$_5$—alkoxycarbonyl, phenyl, chlorophenyl, C$_7$-C$_{10}$ alkylphenyl or C$_7$-C$_{10}$—alkoxyphenyl, or they are benzoyl, in addition R$^3$ is phenyl which is unsubstituted or substituted by —Cl, C$_1$-C$_4$ alkyl, C$_1$-C$_4$—alkoxy or C$_1$-C$_4$—alkylthio, or it is C$_2$-C$_8$—alkoxycarbonyl, —CN, C$_1$-C$_4$—alkyl—NH—CO—, phenyl—NH—CO— or —CONH$_2$, or R$^2$ and R$^3$ together with the carbon atom to which they are bound form a C$_4$-C$_6$—cycloalkyl ring, R$^4$ is, when n=1, C$_1$-C$_{18}$—alkyl, phenyl which is unsubstituted or substituted by halogen, C$_1$-C$_{12}$—alkyl, C$_1$-C$_4$ alkoxy, C$_1$-C$_4$ alkyl— CONH—, phenyl—CONH—, —NO$_2$ or benzoyl, or it is naphthyl which is unsubstituted or substituted by halogen, C$_1$-C$_{12}$—alkyl or C$_1$-C$_4$—alkoxy, or it is C$_5$-C$_6$—cycloalkyl, C$_7$-C$_9$—aralkyl, campheryl, —CF$_3$, —CCl$_3$, —F, or —NH$_2$, and R$^4$ is, when n=2, a —(CH$_2$)$_m$ group, wherein m is 2 to 8, or phenylene or naphthylene each unsubstituted or substituted by C$_1$-C$_{15}$—alkyl, R$^9$ represents a hydrogen atom or one, two or three —Cl, —Br, —NO$_2$, C$_1$-C$_{12}$ alkyl, C$_1$-C$_4$ alkoxy, phenoxy, phenylthio, C$_1$-C$_8$ alkylthio, or —SCH$_2$CH$_2$OH substituents, X represents —O—, —S—, —SO$_2$—, —CH$_2$—, —C(CH$_3$)$_2$— or >NCOR$^{10}$, where R$^{10}$ is C$_1$-C$_4$ alkyl or phenyl, Y represents a direct bond or —CH$_2$—, and R$^{11}$ represents a hydrogen atom; C$_1$-C$_8$ alkyl, C$_1$-C$_8$ alkyl substituted by —OH, —Cl, C$_1$-C$_4$ alkoxy, CN, C$_2$-C$_5$ alkoxycarbonyl, phenyl, chlorophenyl, C$_7$-C$_{10}$ alkylphenyl, or C$_7$-C$_{10}$ alkoxyphenyl; phenyl, phenyl substituted by —Cl, C$_1$-C$_4$ alkyl, C$_1$-C$_4$ alkoxy or C$_1$-C$_4$ alkylthio; C$_2$-C$_8$ alkoxycarbonyl; or CN.

4. A process according to claim 2, in which the sulfonate is of formula

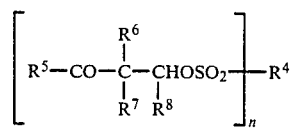 II where n is 1 or 2,

R$^4$ is, when n=1, C$_1$-C$_{18}$—alkyl, phenyl which is unsubstituted or substituted by halogen, C$_1$-C$_{12}$—alkyl, C$_1$-C$_4$ alkoxy, C$_1$-C$_4$—alkyl— CONH—, phenyl—CONH—, —NO$_2$ or benzoyl, or it is naphthyl which is unsubstituted or substituted by halogen, C$_1$-C$_{12}$—alkyl or C$_1$-C$_4$—alkoxy, or it is C$_5$-C$_6$—cycloalkyl, C$_7$-C$_9$—aralkyl, campheryl, —CF$_3$, —CCl$_3$, —F, or —NH$_2$, and R$^4$ is, when n=2, a —(CH$_2$)$_m$ group, wherein m is 2 to 8, or phenylene or naphthylene each unsubstituted or substituted by C$_1$-C$_{15}$—alkyl, R$^5$ is phenyl or naphthyl which are each unsubstituted or substituted by 1,2 or 3 of —Cl, —Br, C$_1$-C$_{12}$—alkyl, phenyl, C$_1$-C$_8$—alkoxy, phenyloxy, benzyloxy, C$_1$-C$_8$—alkylthio, phenylthio, —SCH$_2$CH$_2$OH, C$_1$-C$_4$—alkyl—CONH—, benzoylamino or dimethylamino, or by benzoyl, or R$^5$ is anthryl or phenanthryl, R$^6$ is hydrogen, —OH, C$_1$-C$_4$—alkoxy, —OSi(CH$_3$)$_3$, —OCOCH$_3$, or C$_1$-C$_8$—alkyl which is unsubstituted or substituted by phenyl, R$^7$ is hydrogen, or C$_1$-C$_8$—alkyl which is unsubstituted or substituted by phenyl, or R$^7$ is —CN, benzoyl, C$_1$-C$_4$—alkylcarbonyl, C$_2$-C$_5$—alkoxycarbonyl or phenyl, R$^8$ is hydrogen, C$_1$-C$_8$—alkyl which is unsubstituted or substituted by —OH, —Cl or phenyl, or it is phenyl which is unsubstituted or substituted by —OH, —Cl, C$_1$-C$_4$—alkyl or C$_1$-C$_4$—alkoxy, or R$^8$ is C$_2$-C$_6$—alkenyl, C$_8$-C$_9$—phenylalkenyl, furyl, thienyl or —CCl$_3$, or saturated or unsaturated C$_5$-C$_6$—cycloalkyl, and moreover R$^5$ with R$^7$ or R$^6$ with R$^7$, together with the carbon structure to which they are bound, form a 5- or 6-membered ring which contains 1 to 5 —CH$_2$—, —CH(CH$_3$)—, —(CH$_3$)$_2$—, —O—, —S—, —SO—, —SO$_2$—, —CO—, —N(CO—C$_1$-C$_4$—alkyl)— or N(COC$_6$H$_5$)— groups.

5. A process according to claim 2, in which the sulfonyloxyimide is of formula

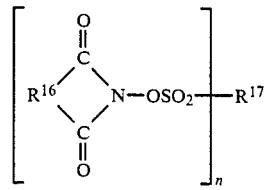 V where n is 1 or 2,

R$^{16}$ represents arylene, substituted arylene, alkylene, substituted alkylene, alkenylene, or substituted alkenylene, $C_2$-$C_6$ straight, branched, or cyclic alkylene, unsubstituted or substituted by phenyl, naphthyl, or $C_1$-$C_4$ alkyl; $C_2$-$C_4$ alkenylene or $C_2$-$C_4$ alkenylene substituted by phenyl or $C_1$-$C_2$ alkyl; and $R^{17}$ represents, where n=1, $C_1$-$C_{18}$ straight or branched alkyl, unsubstituted or substituted by halogen or $C_1$-$C_4$ alkoxy; $C_6$-$C_{12}$ aryl, $C_6$-$C_{12}$ aryl substituted by $C_1$-$C_{15}$ alkyl, $C_1$-$C_4$ alkylCONH, phenyl-CONH, or $NO_2$; $C_5$-$C_6$ cycloalkyl, campheryl; $CF_3$; $CCl_3$; $CH_2Cl$; F; or $NH_2$, or $R^{17}$ represents, where n=2, $C_2$-$C_6$ alkylene, phenylene, or naphthylene, with the proviso that at least one of $R_{16}$ and $R_{17}$ is, or contains, an aromatic group.

6. A process according to claim 2, in which (B) is a sulfonate ester of benzoin or alpha-methylolbenzoin, or a N-sulfonyloxy derivative of 1,8-naphthalimide.

7. A process according to claim 1, in which the film-forming organic material (A) contains a phenolic hydroxyl group or a carboxylic, sulfonic, phosphonic or phosphoric acid group.

8. A process according to claim 7, in which the film-forming organic material (A) is a novolak resin or a homopolymer or copolymer of an ethylenically unsaturated carboxylic acid or carboxylic acid anhydride.

9. A process according to claim 1, in which the composition contains from 0.05 to 0.8 part by weight of the sulfonic acid-releasing substance (B) per part by weight of the film-forming organic material (A).

10. A substrate bearing an image produced by a process according to claim 1.

11. A photosensitive composition, suitable for carrying out the process of claim 1, which comprises
(A) a film-forming organic material consisting essentially of an aqueous base-soluble material having a phenolic hydroxyl group or a carboxylic, sulfonic, phosphonic or phosphoric acid group, and
(B) a substance which releases a sulfonic acid on exposure to actinic radiation,
the composition being substantially free from ethylenically unsaturated material which is polymerized by means of free radicals and from material which is polymerized by sulfonic acids.

12. A composition according to claim 11, in which the substance (B) is a sulfonate ester of an aromatic alcohol containing a carbonyl group or an aromatic N-sulphonyloxyimide.

13. A composition according to claim 12, in which the sulfonate is of formula

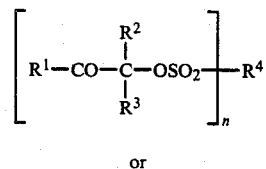

or

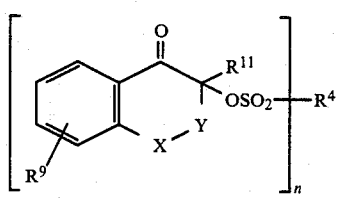

where n is 1 or 2, $R^1$ is phenyl or naphthyl which is unsubstituted, or substituted by 1,2 or 3 of —Cl, —Br, —CN, $NO_2$, $C_1$-$C_{12}$ alkyl, $C_1$-$C_4$—alkoxy phenyloxy, tolyloxy, phenylthio, tolylthio, $C_1$-$C_8$—alkylthio, —$SCH_2CH_2OH$, $C_1$-$C_4$—alkylsulfonyl, phenylsulfonyl, $C_2$-$C_4$—alkoxycarbonyl, $C_1$-$C_4$—alkylamino, $C_2$-$C_4$—dialkylamino, phenyl—CONH— or $C_1$-$C_4$—alkyl—CONH—, or by benzoyl, or $R_1$ is anthryl, phenanthryl, thienyl, pyridyl, furyl, indolyl or tetrahydronaphthyl, and $R^2$ and $R^3$ independently of one another are each hydrogen, or $C_1$-$C_8$ alkyl which is unsubstituted or substituted by —OH, —Cl, $C_1$-$C_4$-alkoxy, —CN, $C_2$-$C_5$—alkoxycarbonyl, phenyl, chlorophenyl, $C_7$-$C_{10}$ alkylphenyl or $C_7$-$C_{10}$—alkoxyphenyl, or they are benzoyl, in addition $R^3$ is phenyl which is unsubstituted or substituted by —Cl, $C_1$-$C_4$ alkyl, $C_1$-$C_4$—alkoxy or $C_1$-$C_4$—alkylthio, or it is $C_2$-$C_8$—alkoxycarbonyl, —CN, $C_1$-$C_4$—alkyl—NH—CO—, phenyl—NH—CO— or —$CONH_2$, or $R^2$ and $R^3$ together with the carbon atom to which they are bound form a $C_4$-$C_6$—cycloalkyl ring, $R^4$ is, when n=1, $C_1$-$C_{18}$—alkyl, phenyl which is unsubstituted or substituted by halogen, $C_1$-$C_{12}$—alkyl, $C_1$-$C_4$ alkoxy, $C_1$-$C_4$—alkyl——CONH—, phenyl—CONH—, —$NO_2$ or benzoyl, or it is naphthyl which is unsubstituted or substituted by halogen, $C_1$-$C_{12}$—alkyl or $C_1$-$C_4$—alkoxy, or it is $C_5$-$C_6$—cycloalkyl, $C_7$-$C_9$—aralkyl, campheryl, —$CF_3$, —$CCl_3$, —F, or —$NH_2$, and $R^4$ is, when n=2, a —$(CH_2)_m$ group, wherein m is 2 to 8, or phenylene or naphthylene each unsubstituted or substituted by $C_1$-$C_{15}$—alkyl, $R^9$ represents a hydrogen atom or one, two or three —Cl, —Br, —$NO_2$, $C_1$-$C_{12}$ alkyl, $C_1$-$C_4$ alkoxy, phenoxy, phenylthio, $C_1$-$C_8$ alkylthio, or —$SCH_2CH_2OH$ substituents, X represents —O—, —S—, —$SO_2$—, —$CH_2$—, —$C(CH_3)_2$— or >$NCOR^{10}$, where $R^{10}$ is $C_1$-$C_4$ alkyl or phenyl, Y represents a direct bond or —$CH_2$—, and $R^{11}$ represents a hydrogen atom; $C_1$-$C_8$ alkyl; $C_1$-$C_8$ alkyl substituted by —OH, —Cl, $C_1$-$C_4$ alkoxy, CN, $C_2$-$C_5$ alkoxycarbonyl, phenyl, chlorophenyl, $C_7$-$C_{10}$ alkylphenyl, or $C_7$-$C_{10}$ alkoxyphenyl; phenyl, phenyl substituted by —Cl, $C_1$-$C_4$ alkyl. $C_1$-$C_4$ alkoxy or $C_1$-$C_4$ alkylthio; $C_2$-$C_8$ alkoxycarbonyl: or CN.

14. A composition according to claim 12, in which the sulfonate is of formula

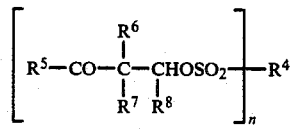

where n is 1 or 2, $R^4$ is, when n=1, $C_1$-$C_{18}$—alkyl, phenyl which is unsubstituted or substituted by halogen. $C_1$-$C_{12}$—alkyl, $C_1$-$C_4$ alkoxy. $C_1$-$C_4$—alkyl— CONH—, phenyl—CONH—, —$NO_2$ or benzoyl or it is naphthyl which is unsubstituted or substituted by halogen, $C_1$-$C_{12}$—alkyl or $C_1$-$C_4$—alkoxy, or it is $C_5$-$C_6$—cycloalkyl, $C_7$-$C_9$—aralkyl, campheryl, —$CF_3$, —$CCl_3$, —F, or —NH$_2$, and R$^4$ is, when n=2, a —(CH$_2$)$_m$ group, wherein m is 2 to 8, or phenylene or naphthylene each unsubstituted or substituted by C$_1$-C$_{15}$—alkyl, R$^5$ is phenyl or naphthyl which are each unsubstituted or substituted by 1,2 or 3 of —Cl, —Br, C$_1$-C$_{12}$—alkyl, phenyl, C$_1$-C$_8$—alkoxy, phenyloxy, benzyloxy, C$_1$-C$_8$—alkylthio, phenylthio, —SCH$_2$CH$_2$OH, C$_1$-C$_4$—alkyl—CONH—, benzoylamino or dimethylamino, or by benzoyl, or R$^5$ is anthryl or phenanthryl, R$^6$ is hydrogen, —OH, C$_1$-C$_4$—alkoxy, —OSi(CH$_3$)$_3$, —OCOCH$_3$, or C$_1$-C$_8$—alkyl which is unsubstituted or substituted by phenyl, R$^7$ is hydrogen, or C$_1$-C$_8$—alkyl which is unsubstituted or substituted by phenyl, or R$^7$ is —CN, benzoyl, C$_1$-C$_4$—alkylcarbonyl, C$_2$-C$_5$—alkoxycarbonyl or phenyl, R$^8$ is hydrogen, C$_1$-C$_8$—alkyl which is unsubstituted or substituted by —OH, —Cl or phenyl, or it is phenyl which is unsubstituted or substituted by —OH, —Cl, C$_1$-C$_4$—alkyl or C$_1$-C$_4$—alkoxy, or R$^8$ is C$_2$-C$_6$—alkenyl, C$_8$-C$_9$—phenylalkenyl, furyl, thienyl or —CCl$_3$, or saturated or unsaturated C$_5$-C$_6$—cycloalkyl, and moreover R$^5$ with R$^7$ or R$^6$ with R$^7$, together with the carbon structure to which they are bound, form a 5- or 6-membered ring which contains 1 to 5 —CH$_2$—, —CH(CH$_3$)—, —CH(CH$_3$)$_2$—, —O—, —S—, —SO—, —SO$_2$—, —CO—, —N(CO—C$_1$-C$_4$—alkyl)— or N(COC$_6$H$_5$)—groups.

15. A composition according to claim 12, in which (B) is a sulfonate ester of benzoin or alpha-methylolbenzoin.

16. A composition according to claim 12, in which the sulfonyloxyimide is of formula

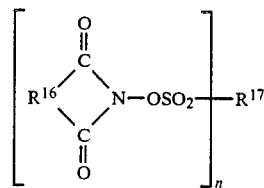

where
n is 1 or 2,
R$^{16}$ represents arylene, substituted arylene, alkylene, substituted alkylene, alkenylene, or substituted alkenylene, C$_2$-C$_6$ straight, branched, or cyclic alkylene, unsubstituted or substituted by phenyl, naphthyl, or C$_1$-C$_4$ alkyl; C$_2$-C$_4$ alkenylene or C$_2$-C$_4$ alkenylene substituted by phenyl or C$_1$-C$_2$ alkyl; and R$^{17}$ represents, where n=1, C$_{1-C_{18}}$ straight or branched alkyl, unsubstituted or substituted by halogen or C$_1$-C$_4$ alkoxy; C$_6$-C$_{12}$ aryl, C$_6$-C$_{12}$ aryl substituted by C$_1$-C$_{15}$ alkyl, C$_1$-C$_4$ alkylCONH, phenylCONH, or NO$_2$; C$_5$-C$_6$ cycloalkyl, campheryl; CF$_3$; CCl$_3$; CH$_2$Cl; F; or NH$_2$, or R$^{17}$ represents, where n=2, C$_2$-C$_6$ alkylene, phenylene, or naphthylene, with the proviso that at least one of R$_{16}$ and R$_{17}$ is, or contains, an aromatic group.

17. A composition according to claim 16, in which (B) is a N-sulfonyloxy derivative of 1,8-naphthalimide.

18. A composition according to claim 11, in which the film-forming organic material (A) contains a phenolic hydroxyl group or a carboxylic, sulfonic, phosphonic or phorphoric acid group.

19. A composition according to claim 18, in which the film-forming organic material (A) is a novolak resin or a homopolymer or copolymer of an ethylenically unsaturated carboxylic acid or carboxylic acid anhydride.

20. A composition according to claim 11, which contains from 0.05 to 0.8 part by weight of the sulfonic acid-releasing substance (B) per part by weight of the film-forming organic material (A).

* * * * *

UNITED STATES PATENT AND TRADEMARK OFFICE
CERTIFICATE OF CORRECTION

PATENT NO. : 4,618,564

DATED : October 21, 1986

INVENTOR(S) : Christopher George Demmer, Edward Irving

It is certified that error appears in the above-identified patent and that said Letters Patent is hereby corrected as shown below:

Claim 4, Column 12, Line 41, should read --
substituted by -OH, -Cl or phenyl, or it is phenyl --.

Claim 4, Column 12, Line 50 should read --
-CH(CH3)-,-C(CH3)2-, -O-, -S-, -SO-, --.

Claim 14, Column 15, Line 34 should read --
-CH(CH3)-,-C(CH3)2-, -O-, -S-, --.

Signed and Sealed this

First Day of September, 1987

Attest:

DONALD J. QUIGG

Attesting Officer

Commissioner of Patents and Trademarks